United States Patent
Hiller et al.

(10) Patent No.: US 7,674,678 B2
(45) Date of Patent: Mar. 9, 2010

(54) METHOD FOR PRODUCING A TRANSISTOR COMPONENT HAVING A FIELD PLATE

(75) Inventors: Uli Hiller, Bad Abbach (DE); Oliver Blank, Freising (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/115,168

(22) Filed: May 5, 2008

(65) Prior Publication Data
US 2009/0273024 A1    Nov. 5, 2009

(51) Int. Cl.
*H01L 21/336* (2006.01)
(52) U.S. Cl. ....................................................... 438/259
(58) Field of Classification Search ................. 438/259, 438/488, 140, 137, 270, 257, 258, 454; 257/330, 257/328, 491, 493, 500, 135, 239
See application file for complete search history.

(56) References Cited

U.S. PATENT DOCUMENTS 6,653,691 B2 * 11/2003  Baliga .......................... 257/390

2004/0031987 A1 * 2/2004  Henninger et al. ............. 257/328
2005/0215010 A1 * 9/2005  Henninger et al. ............. 438/259

OTHER PUBLICATIONS

Quirk, "Semiconductor manufacturing technology", 2001, Prentice-Hall, pp. 515-544.*

* cited by examiner

*Primary Examiner*—Thomas L Dickey
*Assistant Examiner*—Nikolay Yushin
(74) *Attorney, Agent, or Firm*—Dicke, Billig & Czaja, PLLC (57) ABSTRACT

A method for producing a transistor component having a field plate. One embodiment includes providing a semiconductor body having a first side, and including a first trench extending into the semiconductor body. A field plate dielectric layer is produced on the first side and at uncovered areas of the first trench such that a residual trench remains. A field plate layer is produced in the residual trench. The first side of the semiconductor body is uncovered using a polishing method. The field plate dielectric layer is partially removed from the at least one first trench proceeding from the first side.

16 Claims, 10 Drawing Sheets

METHOD FOR PRODUCING A TRANSISTOR COMPONENT HAVING A FIELD PLATE

BACKGROUND

One operating parameter of transistor components is their gate-drain capacitance. If the transistor component is used as a switching element for switching a load, then the gate-drain capacitance influences the switching behavior of the transistor component. The gate-drain capacitance influences in particular the switching speed of the component, and hence the gradient of switching edges of a current flowing through the component or of a voltage present across the component.

The gate-drain capacitance of the transistor component is dependent for example on the area in which a gate electrode and a drain zone or a drift zone of the component overlap one another. During the production of the component it is desirable in this case to be able to set or reproduce this overlap area as precisely as possible in order to be able to set the switching behavior of the component as precisely as possible.

For these and other reasons, there is a need for the present invention.

SUMMARY

One embodiment of the present description relates to a method for producing a transistor component having a field plate, which includes: providing a semiconductor body having a first side and having at least one first trench extending into the semiconductor body proceeding from the first side; producing a field plate dielectric layer on the first side and at uncovered areas of the first trench in such a way that a residual trench remains; producing a field plate layer in the residual trench; uncovering the first side of the semiconductor body by using a polishing method; partially removing the field plate dielectric layer from the at least one first trench proceeding from the first side.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
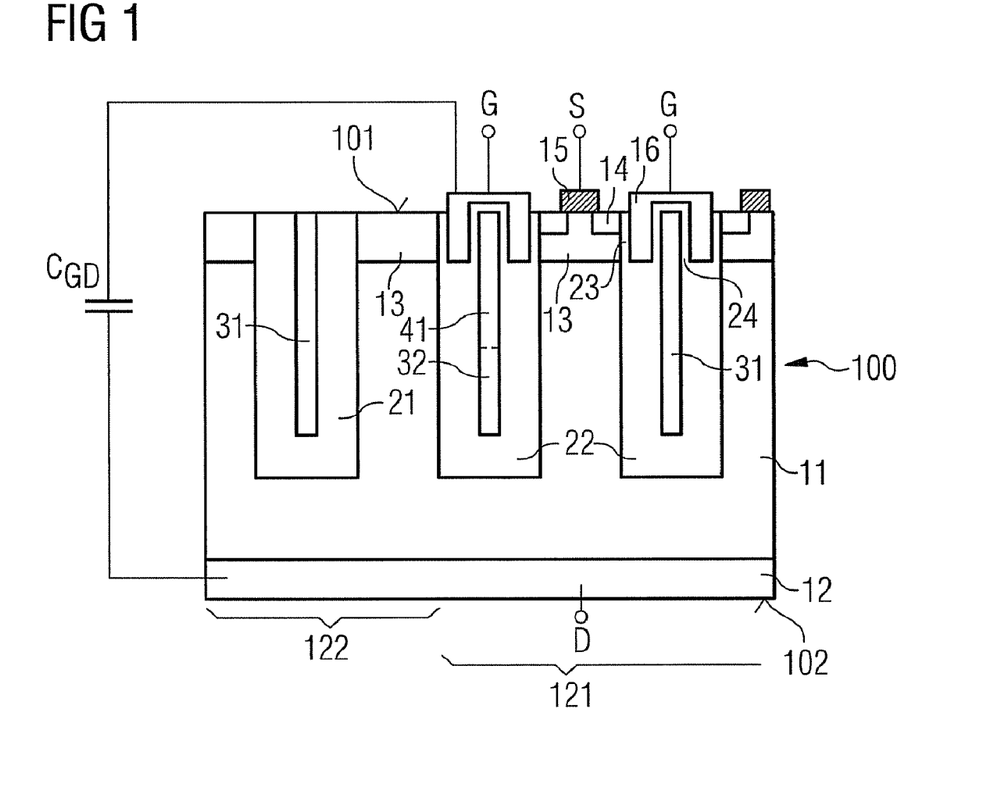
FIG. 1 illustrates a transistor component having a field plate and a field plate dielectric on the basis of a cross-sectional illustration.

FIG. 1 illustrates a transistor component on the basis of a schematic cross-sectional illustration. The component has a semiconductor body 100 having a first side 101, which is designated hereinafter as front side, and a second side 102, which is designated hereinafter as rear side. FIG. 1 illustrates a vertical cross section through the semiconductor body, that is to say a cross section in a sectional plane running vertically with respect to the front and rear sides 101, 102.

The transistor component is constructed in cellular fashion, for example, and has a number of transistor cells of identical type, each having a gate electrode 16, a field plate or field electrode 31, a body zone 13 and a source zone 14. In this case, the gate electrode 16 and the field electrode 31 of a transistor cell are arranged in a common trench extending into the semiconductor body 100 in a vertical direction proceeding from the front side 101. The field plate 31 is dielectrically insulated from semiconductor regions of the semiconductor body 100 by a field plate dielectric 22, and the gate electrode 16 is dielectrically insulated from semiconductor regions of the semiconductor body 100 by a gate dielectric 23. In the example illustrated, the field plate 31 and the gate electrode 16 are insulated from one another by a further dielectric layer or insulation layer 24. In a manner not illustrated more specifically, the field plate 31 is connected for example to the source zone 14 or a source terminal S of the component. As an alternative, there is the possibility of the field plate 31 and the gate electrode 16 being electrically conductively connected to one another (not illustrated).

The transistor component additionally has a drift zone 11, which is adjacent to the body zones 13 of the individual transistor cells and which is common to all the transistor cells of the component. A drain zone 12 is adjacent to the drift zone 11 at an opposite side to the body zones 13.

The component illustrated is a normally off component, for example. In this case, the body zone 13 is doped complementarily with respect to the source zone 14 and the drift zone. In the case of an n-conducting component, the source zone 14 and the drift zone 11 are n-doped, while the body zone 13 is p-doped. In the case of a p-conducting component, the component zones are correspondingly doped complementarily. The component illustrated can furthermore be realized as a MOSFET or as an IGBT. In the case of a MOSFET, the drain zone 12 is of the same conduction type as the drift zone 11, but doped more highly than the drift zone 11. In the case of an IGBT, the drain zone 12 is doped complementarily with respect to the drift zone 11. In the case of an IGBT, a field stop zone (not illustrated) may optionally be present between the drift zone 11 and the drain zone 12. In this case, the field stop zone is of the same conduction type as the drift zone, but doped more highly.

In the component illustrated, the gate electrode 16 serves for controlling a conducting channel in the body zone 13 along the gate dielectric 23 between the source zone 14 and the drift zone 11. The component is turned on if such a conducting channel (inversion channel) is present in the body zone 13 between the source zone 14 and the drift zone 11. In the case of an n-conducting component, it is necessary for this purpose, in a manner known in principle, to apply to the gate electrode 16 an electrical potential lying above the electrical potential of the source zone 14 of the component. The component is turned off if such a conducting channel is not present in the body zone 13 and if a voltage that reverse-biases a pn junction between the body zone 13 and the drift zone 11 is present between the drain zone 12 and the source zone 14. In the case of an n-conducting component, the voltage is a positive voltage between the drain zone 12 or at the drain terminal D and the source zone 14 or a source terminal S. When the component is driven in the off state, the field plate 31, which is at source potential (or else at gate potential), for example, provides a countercharge with respect to a part of the dopant charge present in the drift zone 11. In a manner known in principle, for a given dielectric strength of the component, this enables a higher doping of the drift zone 11 in comparison with a component without a field plate, and hence a lower on resistance.

In a manner not illustrated more specifically, the individual transistor cells of the component are connected in parallel by virtue of the gate electrodes 16 being electrically conductively connected to one another and the source zones 14 being electrically conductively connected to one another. In a manner known in principle, the body zones 13 and the source zones 14 of the individual transistor cells can be short-circuited with one another. In the case of the component in accordance with FIG. 1, a source electrode 15 is present for this purpose, the source electrode making contact with the source zone 14 and the body zone 13 of a transistor cell.

The transistor component illustrated has a gate-drain capacitance. The gate-drain capacitance is dependent on the extent to which the gate electrode 16 and the drift zone 11 overlap one another. In the example illustrated, this overlap is dependent on how far the gate electrode 16 extends into the semiconductor body 100 in a vertical direction and how far the body zone 13 extends into the semiconductor body 100 proceeding from the first side 101. The gate-drain capacitance $C_{GD}$, the circuit symbol of which is illustrated schematically in FIG. 1, determines the switching behavior of the component in a manner known in principle. The gate-drain capacitance determines in particular the switching speed of the component, that is to say the speed at which the component undergoes transition from an on state to an off state, and vice versa. During the production of the component it is desirable to be able to reproduce or set the gate-drain capacitance as exactly as possible.

The component can have a multiplicity of transistor cells of identical type, each having a gate electrode 16, a field plate 31, a body zone 13 and a source zone 14. A region of the semiconductor body 100 in which such transistor cells are present is designated by the reference symbol 121 in FIG. 1. This region is also referred to hereinafter as inner region of the transistor cell array. The transistor component can additionally have modified transistor cells or edge cells in an edge region 122 that delimits the transistor cell array in a lateral direction of the semiconductor body 100. The edge cells, only one of which is illustrated in FIG. 1, have for example a field plate 31 and a field plate dielectric 21, which dielectrically insulates the field plate 31 from the semiconductor body 100. However, the edge cells have no gate electrode 16 and optionally no source zone either. The field plate 31 of the edge cell can be at the same electrical potential as the field plates of the transistor cells in the inner region 121. In a manner not illustrated more specifically, there is the possibility of providing a plurality of edge cells in the edge region. The fact of whether a plurality of edge cells are used and how many of such edge cells are used is dependent on the desired dielectric strength of the component. The plurality of edge cells can be realized such that they are at different electrical potentials, wherein the electrical potential of the edge cells increases in a direction of the edge of the component. The field plate of the edge cell which is arranged closest to the transistor cell array can be at source potential, for example, while the electrical potential of the field plates of the rest of the edge cells can increase from edge cell to edge cell in a direction of the edge. Components having a plurality of edge cells are for example components having a dielectric strength of 200 V or 250 V, or more.

The field plates of the transistor cells in the inner region can be realized in various ways. One example provides for the field plates to extend in a vertical direction as far as the gate electrode 16 or as far as the level of the front side 101 of the semiconductor body 100. Such field plates, one of which is illustrated in the right-hand part of FIG. 1, are designated by the reference symbol 31 below.

As an alternative, there is the possibility of realizing the field plates in such a way that they are only arranged in the lower trench, as is illustrated for the transistor cell in the middle of FIG. 1. Such a field plate that is only arranged in the lower region of the trench is designated by the reference symbol 32 below. In a direction of the first side 101, a dielectric layer 41, for example, such as e.g., a nitride layer, is adjacent to such a field plate 32.

A possible method for producing the field plate dielectrics 21, 22 for the transistor cells in the inner region and the edge cell and also for the field plates 31 is explained below with reference to FIGS. 2A to 2G. In this case, the figures illustrate vertical cross sections through the semiconductor body 100 during individual method processes of the method.

Figure 2A:
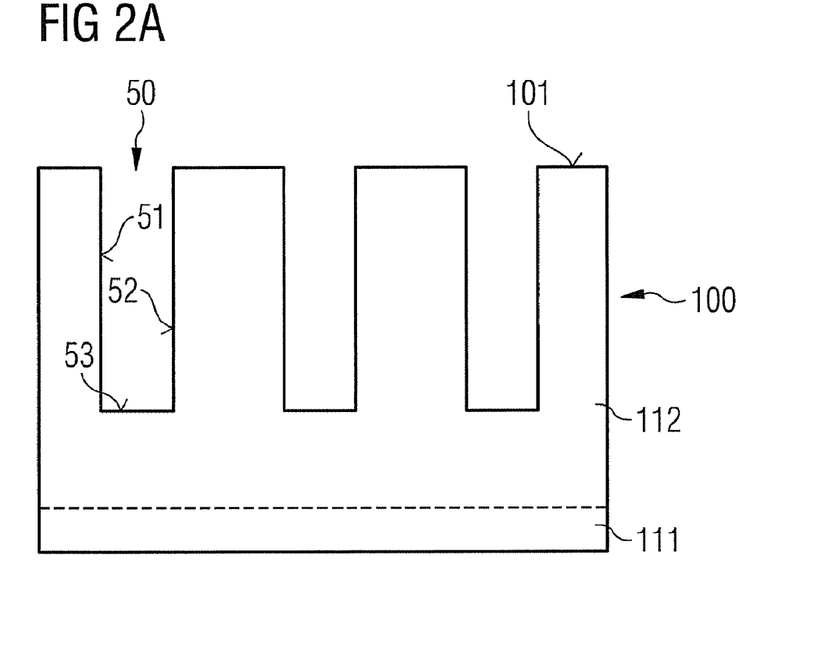
FIG. 2 illustrates a first example of a method for producing a field plate dielectric and a field plate.

FIG. 2A illustrates a semiconductor body 100 after first method processes have been carried out, which involve producing a plurality of trenches 50 which are in each case arranged at a distance from one another and extend into the semiconductor body 100 in a vertical direction proceeding from the first side 101. The trenches have an extent in a vertical direction of the semiconductor body 100, which is referred to hereinafter as depth, an extent in a first horizontal direction, which is referred to hereinafter as width, and an extent in a second lateral direction, which is referred to hereinafter as length. In the example illustrated, the first lateral direction runs in the plane of the drawing, while the second lateral direction runs perpendicular to the plane of the drawing. The individual trenches run parallel to one another, for example. In this case, the length of the individual trenches is greater than the width thereof.

The concrete dimensions of the trenches, in particular the width and depth thereof, depend greatly on the voltage class, that is to say on the breakdown voltage strength, of the component. The depth of the trenches is for example 3-4 µm for components having a dielectric strength of between 50 V and 60 V and ranges for example up to 15-20 µm for components having a dielectric strength of between 300 V and 350 V. The width of the trenches correspondingly ranges from approximately 800 nm up to 6-7 µm. The length of the trenches is determined by the dimensions of the semiconductor body 100. A typical area (chip area) of the semiconductor body 100 is 30 mm², for example. In this case, the trenches for the later transistor cells run parallel to one another over approximately the entire length or width of the semiconductor body and end in each case at such a distance from the edge of the semiconductor body 100 that between the end of the trenches and the edge there is still enough space for an edge termination including the edge cells. In this case, the trench or trenches of the later edge cells can be realized such that they enclose the trenches for the later transistor cells in ring-shaped fashion. It should be pointed out in this connection that the figures illustrate cross sections through the semiconductor body 100 in those regions in which the trenches of the edge cell or edge cells and of the transistor cells run parallel to one another.

In a manner not illustrated more specifically, the individual trenches 50 are produced for example by using an etching method using a mask (not illustrated) which, during the etching method, leaves free those sections of the first side 101 in which the trenches 50 are intended to be produced.

The individual trenches 50 each have two areas which are opposite one another and which are referred to hereinafter as side areas or sidewalls, and an area 53 which is arranged at the lower end of the trenches 50 proceeding from the front side 101 and which is referred to hereinafter as trench bottom. It should be noted in this connection that the trenches 50 illustrated in the figures have a rectangular cross section only for the sake of simplifying the illustration. In one embodiment, the trenches 50 actually have a cross section that usually deviates from a rectangular cross section. Thus, the sidewalls 51, 52 can for example run obliquely relative to the first side 101 in such a way that the trench width decreases with increasing distance from the first side 101. This decrease in the trench width can take place uniformly or else nonuniformly with increasing depth. Furthermore, the trench bottom 53 can be rounded, for example, with respect to the sidewalls 51, 52.

The semiconductor body 100 in which the trenches 50 are produced is a monocrystalline semiconductor body, in particular. This semiconductor body 100 can be doped homogenously. Furthermore, the semiconductor body 100 can also be realized such that it has two differently doped semiconductor layers, namely a first semiconductor layer 111 and a second semiconductor layer 112 applied to the first semiconductor layer 111. The first semiconductor layer 111 is for example a highly doped semiconductor substrate which forms the later drain zone of the component. In this case, the second semiconductor zone 112 is for example a more weakly doped semiconductor layer which was applied to the first semiconductor layer 111 by using an epitaxy method, for example. Sections of the second semiconductor layer 111 can form the drift zone (11 in FIG. 1) of the later transistor component. If the semiconductor body 100 is constructed in two layers in this way, then the trenches 50 are produced for example in such a way that the trenches 50 proceeding from the front side 101 end whilst still in the second semiconductor layer 112, that is to say do not extend right into the first semiconductor layer 111. The second semiconductor layer 112 can be doped homogenously, but can have a varying doping profile. Thus, the second semiconductor layer 112 can be doped for example in such a way that its doping concentration increases in a direction of the first side 101. Such a variation of the doping concentration can be used for example to set the on resistance of the component or to set the location within the semiconductor body at which a voltage breakdown first commences upon a maximum dielectric strength being reached.

Figure 2B:
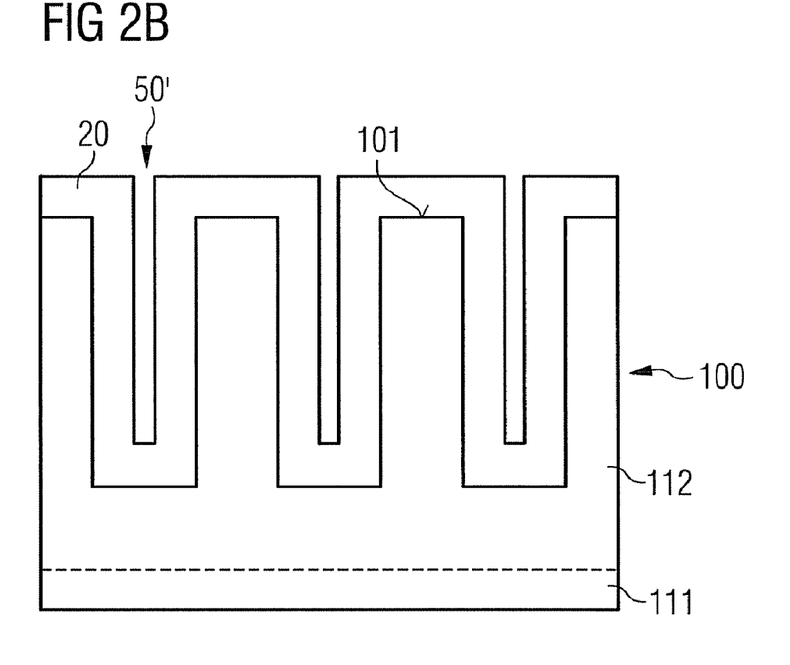

After the trenches 50 have been produced, a field plate dielectric layer 20 is produced at uncovered areas of the trenches, that is to say at the sidewalls and bottom of the trenches, and also at uncovered areas of the first side 101 of the semiconductor body 100. FIG. 2B illustrates the semiconductor body 100 in cross section after these method processes have been carried out. The field plate dielectric layer 20 is produced for example by thermal oxidation of the semiconductor body 100. In this case, the field plate dielectric layer 20 is an oxide layer, that is to say a layer of silicon oxide ($SiO_2$) when a semiconductor body 100 composed of silicon is used. As an alternative, the field plate dielectric layer 20 can be produced by depositing a dielectric layer, for example an oxide layer.

The field plate dielectric layer 20 is produced in such a way that residual trenches 50' remain in the region of the original trenches (50 in FIG. 2A) after the production of the field plate dielectric layer 20, the residual trenches having a smaller width than the original trenches 50 in the example. In this case, the production of the original trenches 50 is coordinated with the method for producing the field plate dielectric layer 20. If the intention is to achieve a specific thickness of the field plate dielectric layer 20 and a specific width of the residual trenches 50', then it is possible, in the case where the field plate dielectric layer 20 is produced by thermal oxidation involving the oxidation of regions of the semiconductor body 100 which are near the surface, for the trench width of the original trenches 50 to be chosen to be smaller than in the case where the field plate dielectric layer 20 is produced by depositing a dielectric layer.

Figure 2C:
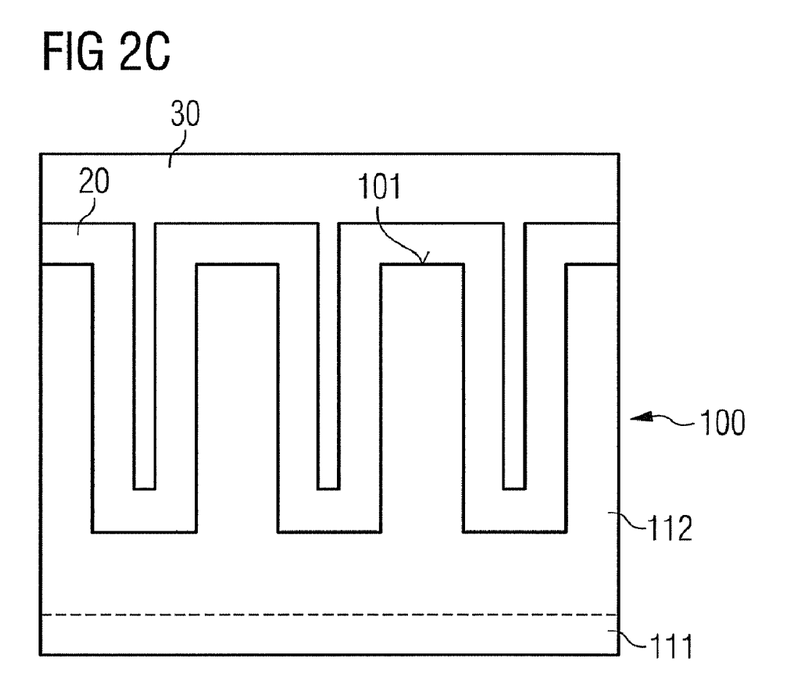

After the field plate dielectric layer 20 has been produced, a field plate layer is applied to the field plate dielectric layer 20, the result of which is illustrated in FIG. 2C. The field plate layer 30 is composed of an electrically conductive material such as, for example, a metal or a highly doped polycrystalline semiconductor material such as polysilicon, for example. The field plate layer 30 is produced in such a way that the residual trenches 50' are filled at least as far as the level of the first side 101 of the semiconductor body 100. In this connection "filling" should be understood to mean that the filling material extends from sidewall to sidewall, such that no further residual trench remains. Referring to FIG. 2C, the field plate layer 30 can be produced in particular in such a way that the field plate layer 30 fills the residual trenches 50' completely, that is to say toward the top, and furthermore covers the field plate dielectric layer 20 above the first side 101 of the semiconductor body 100.

Figure 2D:
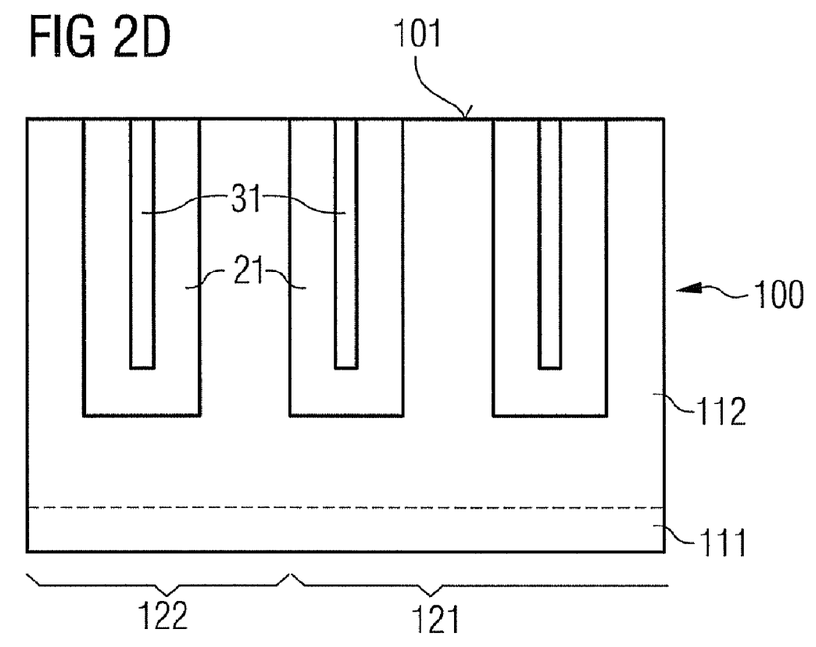

The field plate dielectric layer 20—and, if appropriate, the field plate layer 30—are subsequently removed by using a polishing method until the first side 101 of the semiconductor body 100 is uncovered. The result of this is illustrated in FIG. 2D. The polishing method is for example a mechanical polishing method or a chemical-mechanical polishing (CMP) method. After the conclusion of these method processes, field plates 31 are present which extend into the semiconductor body 100 in a vertical direction proceeding from the front side 101 and which are dielectrically insulated from semiconductor regions of the semiconductor body 100 by field plate dielectrics 21. In this case, the field plates 31 result from the field plate layer 30, while the field plate dielectrics 21 result from the field plate dielectric layer 20. In this case, the width of the field plates 31 corresponds to the width of the residual trenches (50' in FIG. 2B) in which the field plate layer (30 in FIG. 2C) was deposited. In accordance with the trench width and the trench depth, the width of the field plates 31 is dependent on the desired dielectric strength of the component. In one embodiment, for the abovementioned components having dielectric strengths of between 50 V and 350 V, the width of the field plates is for example between approximately 300 nm and 2-2.5 μm.

Figure 2E:
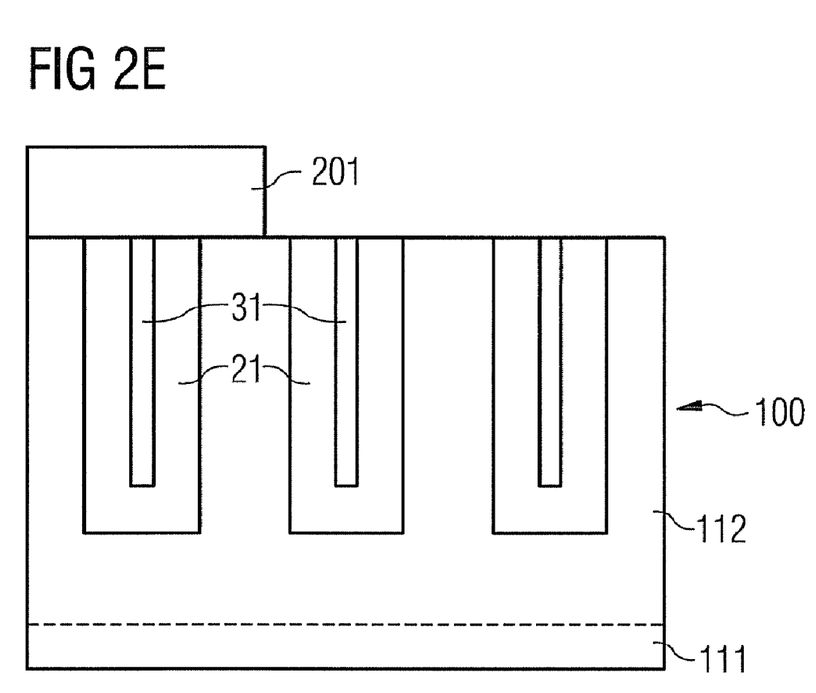

The method processes explained above are carried out equally for all later transistor cells, that is to say both for the transistor cells in the inner region and for the edge cells. Further method processes, which are explained below with reference to FIGS. 2E to 2G, differ for transistor cells in the inner region and for edge cells. Trenches having a field plate arranged therein and a field plate dielectric arranged therein which are part of later transistor cells are referred to hereinafter as first trenches. Trenches having a field plate arranged therein and a field plate dielectric arranged therein which are part of a later edge cell of the component are referred to hereinafter as second trenches. Referring to FIG. 2E, a protective layer 201 is applied to the front side 101 over the second trenches, only one of which is illustrated in FIG. 2E, the protective layer leaving free the first trenches. Such a protective layer is produced for example by whole-area deposition of such a protective layer and subsequent patterning of the protective layer using a mask technique. The protective layer is for example a patterned oxide hard mask or is composed of a material which can be etched selectively with respect to an oxide, such as a photo resist, for example. The protective layer can also be a nitride layer which was patterned using a resist mask.

Figure 2F:
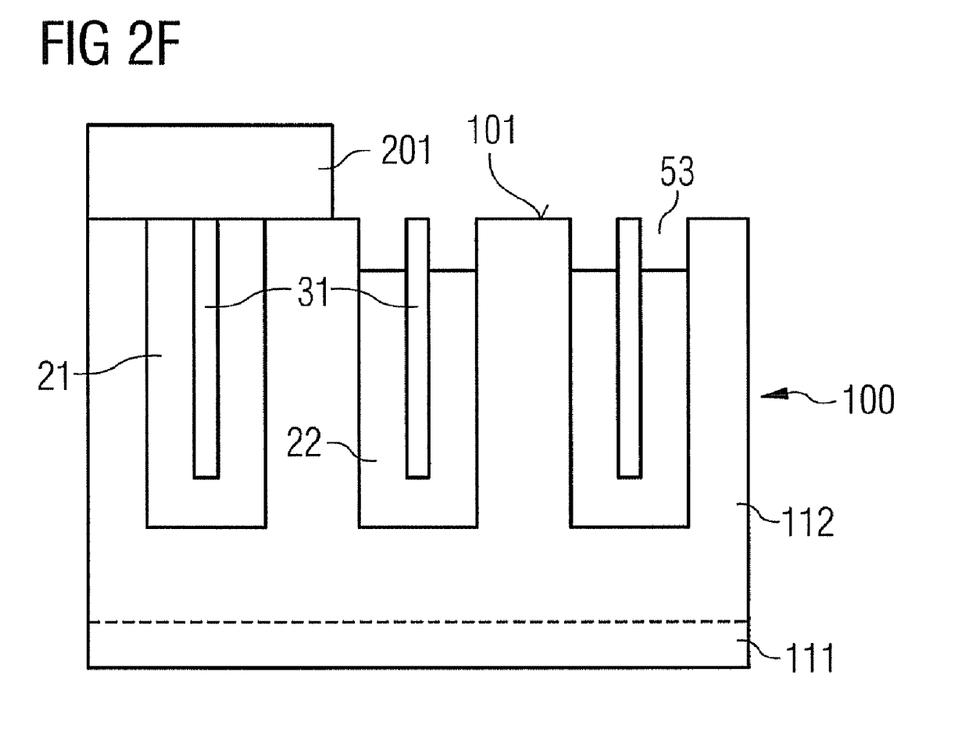

Referring to FIG. 2F, the field plate dielectric 21 in the first trenches is removed in sections proceeding from the first side 101. What is suitable for this purpose is for example an etching method which etches the field plate dielectrics 21 selectively with respect to the material of the semiconductor body 100 and with respect to the field plates 31, such that the field plate dielectrics in the first trenches are etched back proceeding from the first side 101. This gives rise to cutouts 53 which are delimited toward the sides by the field plates 31 and the semiconductor body 100 and which are delimited downwardly by the residual part of the field plate dielectric. These field plate dielectrics 22 produced by partial removal of dielectric material are referred to hereinafter as first field plate dielectrics. The field plate dielectrics 21 of the edge cells, which are already present before this method process is carried out, are referred to hereinafter as second field plate dielectrics.

Figure 2G:
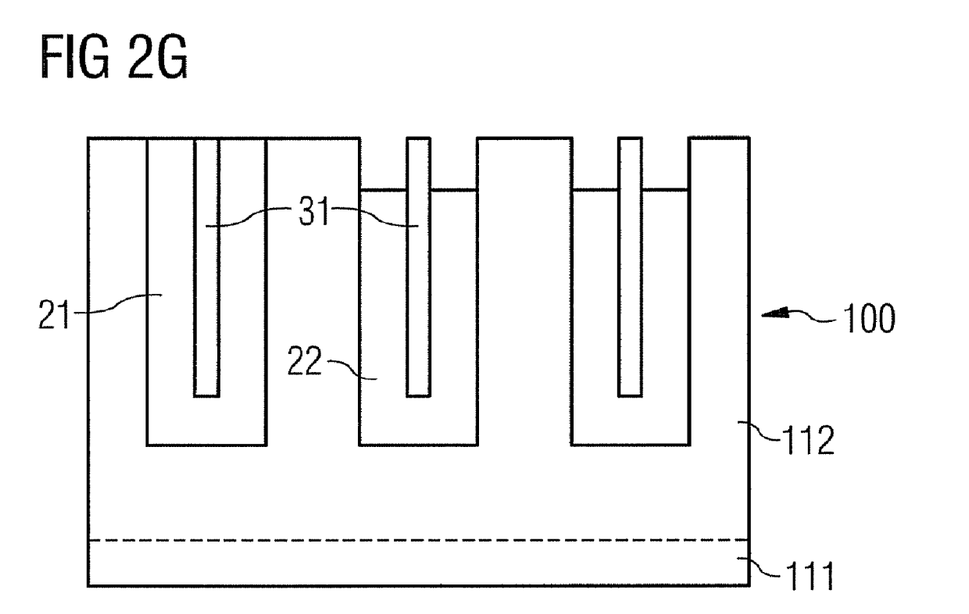

During the method processes used for partially removing the field plate dielectric in the first trenches, the protective layer 201 protects the field plate dielectric 21 in the second trenches. The protective layer 201 is removed after these method processes have been carried out, the result of which is illustrated in FIG. 2G.

Figure 3A:
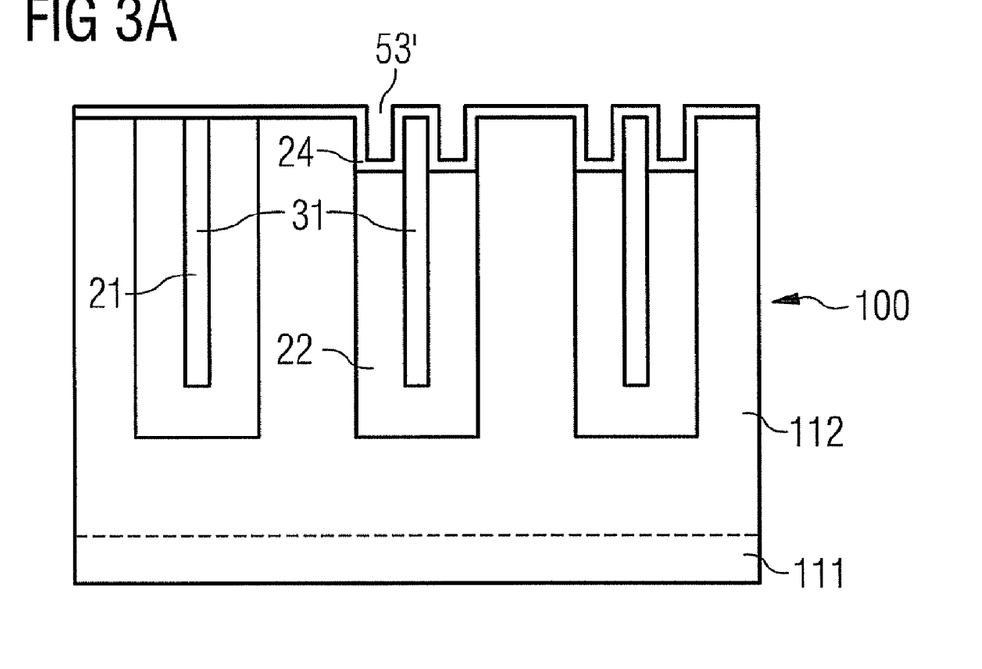
FIG. 3 illustrates further method processes used for producing a gate dielectric and a gate electrode.

After the production of the field plates 31 and the first field plate dielectrics 22 in the first trenches and the field plates 31 and the second field plate dielectrics 21 in the second trenches, it is possible to perform customary method processes for completing the component, that is to say for producing the gate dielectrics and the gate electrodes in the individual trenches, and also the body zones and the source zones. Possible method processes for producing the gate electrodes 16 in the first trenches are explained below with reference to FIGS. 3A and 3B. Referring to FIG. 3A, firstly a gate dielectric layer 23 is produced at least in the cutouts 53 of the first trenches. The gate dielectric layer 23 is produced for example by thermal oxidation or by depositing a dielectric layer 24 suitable for producing the gate dielectrics, such as an oxide layer, for example. In this case, the thickness of the gate dielectric layer 23 produced is thinner than the field plate dielectric layer produced for producing the field plate dielectrics 21, 22.

The thickness of the field plate dielectrics depends on the desired dielectric strength in accordance with the trench width and the trench depth. For the abovementioned components having dielectric strengths of between 50 V and 350 V, the thickness of the field plate dielectrics is for example between approximately 250 nm and 2-2.25 μm. The thickness of the gate dielectric layer 23 crucially determines the threshold voltage of the component. In one embodiment, typical values for this thickness of the gate dielectric layer are 50 nm to 80 nm.

Figure 3B:
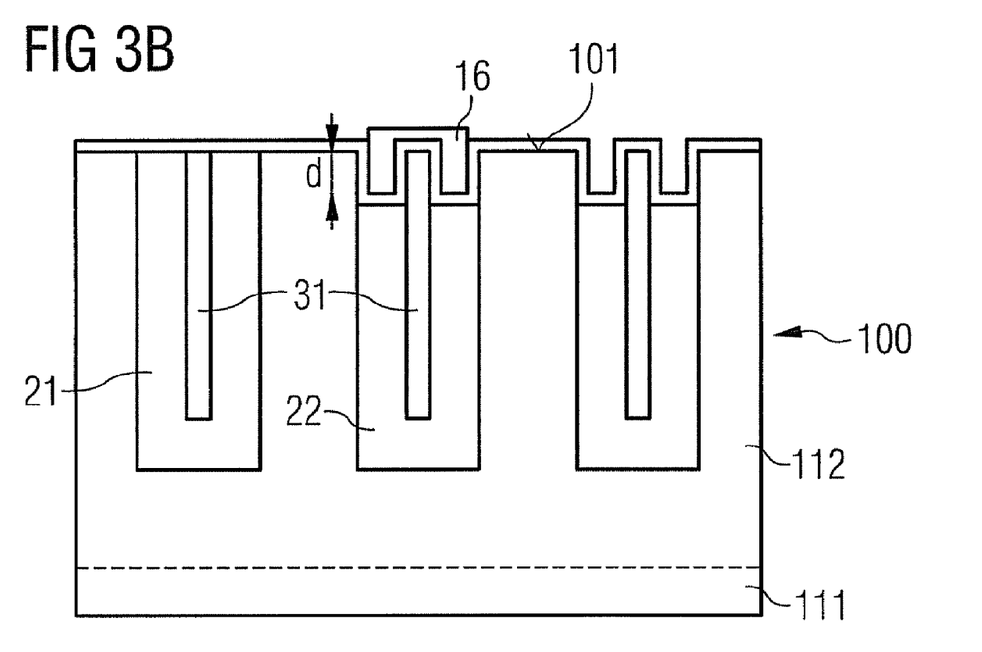

The thickness of the dielectric layer 24 produced is dimensioned in particular such that residual cutouts 53' remain in the region of the cutouts 53. The residual cutouts 53' are subsequently filled with an electrically conductive material such as, for example, a metal or a highly doped polycrystalline semiconductor material such as e.g., polysilicon. This gives rise to gate electrodes 16, the result of which is illustrated in FIG. 3B. The gate electrodes 16 are produced for example by whole-area deposition of an electrode layer and subsequent patterning of the electrode layer in such a way that the electrode layer is removed again above the first side 101. The semiconductor region situated below the first side 101 and between adjacent trenches is referred to as mesa region. The body zones and the source zones of the component are produced in the mesa region during subsequent method processes, the result of which is illustrated in FIG. 1. In this case, the electrode layer deposited for producing the gate electrodes 16 has to be removed at least in sections above the mesa regions in order to enable contact to be made with the source and body zones of the component.

The body zones and the source zones are produced for example by implantation and/or diffusion of dopant atoms into the semiconductor body via the first side 101. In this case, the extent of the body zone (13 in FIG. 1) proceeding from the front side 101 is determined by the conditions under which the body zone is produced, such as, for example, implantation dose and implantation energy and/or diffusion duration and diffusion temperature. The dimensions of the body zone 13 can be set comparatively exactly by using these parameters. The dimensions of the gate electrode 16 in a vertical direction of the semiconductor body, in particular a distance from a lower end of the gate electrode 16 as far as the first side 101, which distance is designated by d in FIG. 3B, is determined by the depth of the cutouts 53 produced after the uncovering of the first side 101—and, if appropriate, by the thickness of the gate dielectric layer 24 also produced on the second field plate dielectrics 22. If, by contrast, the gate dielectric layer is produced by thermal oxidation, then exclusively the depth of the cutout 53 determines the vertical dimension of the gate electrode 16. This is because although such thermal oxidation oxidizes the semiconductor material at sidewalls of the cutout 53, the field plate dielectric 22 is not oxidized further. In this case, the depth of the cutouts 53 can be set comparatively exactly by using the etching method used for etching the field plate dielectrics proceeding from the front side 101. The thickness of a gate dielectric layer 24 deposited, if appropriate, on the field plate dielectrics 22 in the cutouts 53 can also be set comparatively exactly. By virtue of the depth d of the gate electrodes 16 proceeding from the front side 101 having good reproducibility in the case of the method explained, namely in particular by using the depth of the cutouts 53, the overlap region between the gate electrode and the body zone or conversely between the gate electrode and the later drift zone (11 in FIG. 1) of the component has good reproducibility.

Figure 4A:
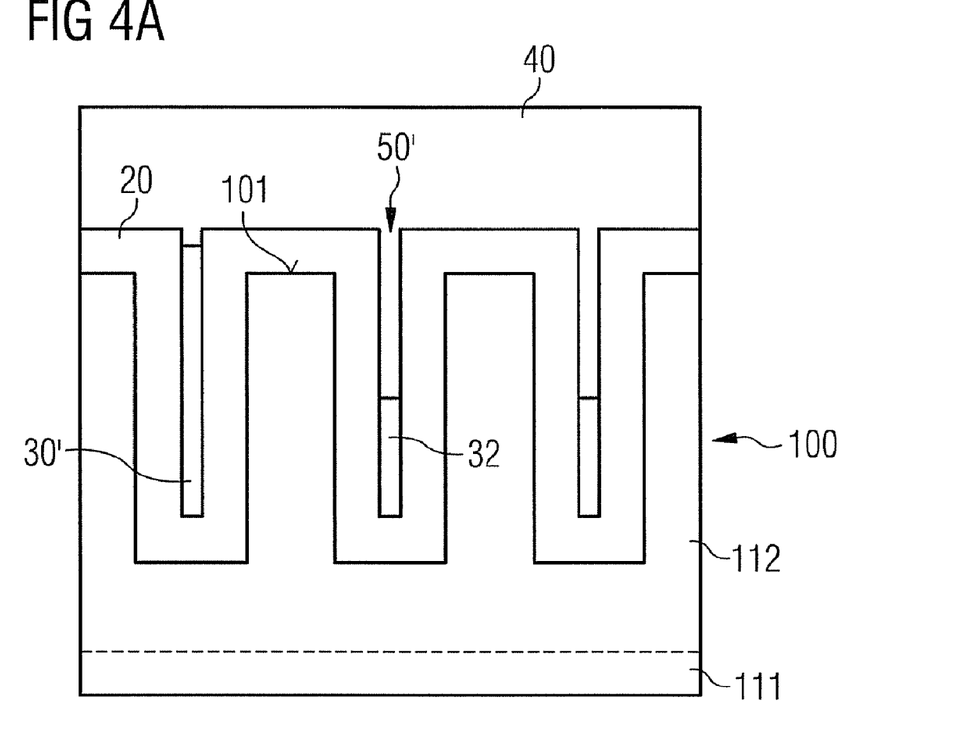
FIG. 4 illustrates a second example of a method for producing a field plate.

A further method for producing field plates and field plate dielectrics in the individual trenches is explained below with reference to FIGS. 4A to 4E. Referring to FIG. 4A, in this method firstly a field plate dielectric layer 20 is produced at uncovered areas of the trenches and the first side 101 of the semiconductor body. The field plate dielectric layer 20 is produced for example using the method processes explained with reference to FIGS. 2A and 2B. A field plate layer is subsequently produced on the field plate dielectric layer 20, the field plate layer having a plurality of layer sections in the example illustrated, namely first layer sections 32 composed of an electrically conductive material in the first trenches. The first layer sections composed of the electrically conductive material form the later field plates of the component 32 and are arranged only in the lower region of the residual trenches 50', that is to say at a distance from the first side 101 of the semiconductor body. The field plate layer includes second layer sections 30' in the second trenches. The second layer sections 30' are composed of an electrically conductive material such as, for example, a metal or a highly doped polycrystalline semiconductor material and fill the residual trenches in the region of the second trenches at least as far as the level of the first side 101. The field plate layer includes a third layer section 40, which, in the example illustrated, completely fills the residual trenches in the region of the first trenches and furthermore completely covers the field plate dielectric layer 20 above the first side 101. This third partial layer 40 is composed of a dielectric material, for example, such as e.g., a nitride. The second layer sections 30' and the field plates 32 of the later transistor cells can be composed of the same material.

Figure 4B:
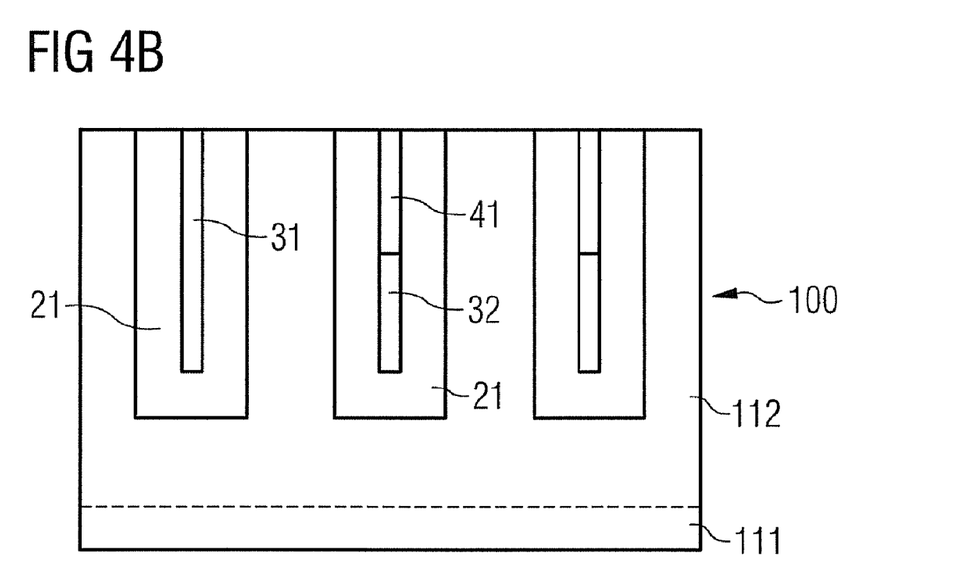
Figure 4C:
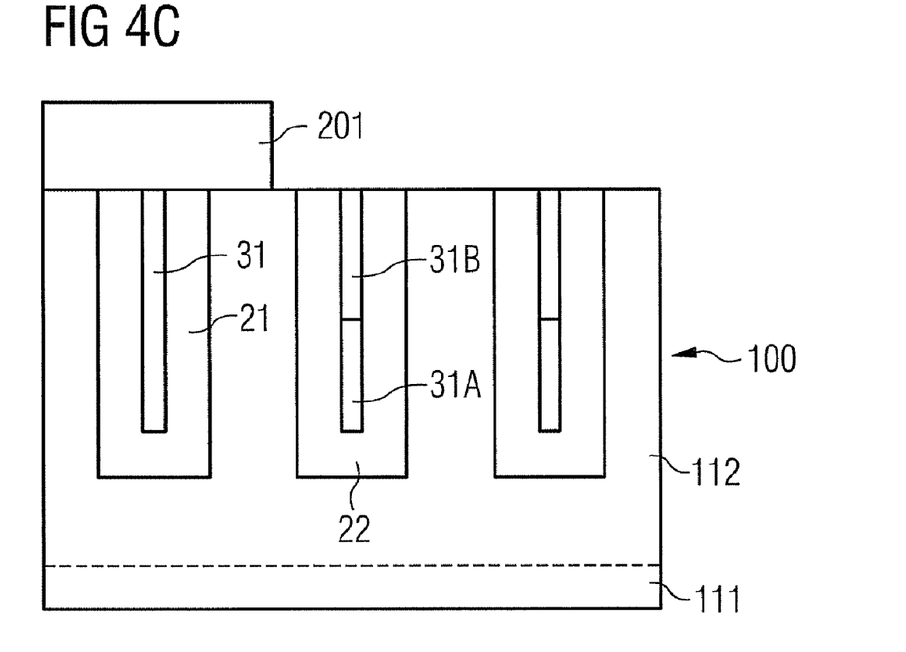

The further method processes explained below with reference to FIGS. 4B to 4E correspond to the method processes already explained with reference to FIGS. 2D to 2G. Referring to FIG. 4B, the field plate dielectric layer 20 and the field plate layer are removed by using a polishing method until the first side 101 of the semiconductor body 100 is uncovered above mesa regions between the individual trenches. The result of these method processes is the field plates 32 already previously present in the first trenches in the lower region, and insulating plates 41 which are arranged above the field plates 32 and which fill the residual trenches 50' as far as the first side 101. Field plates 31 composed of an electrically conductive material are present in the region of the second trenches, the field plates extending as far as the first side 101 of the semiconductor body. The field plates 32 and insulated plates 41 in the region of the first trenches and the field plates 31 in the region of the second trenches are dielectrically insulated from semiconductor regions of the semiconductor body 100 by field plate dielectrics 21. Referring to FIG. 4C, the protective layer 201 already explained above is subsequently applied leaving over the second trenches, the protective layer free the first trenches.

Figure 4D:
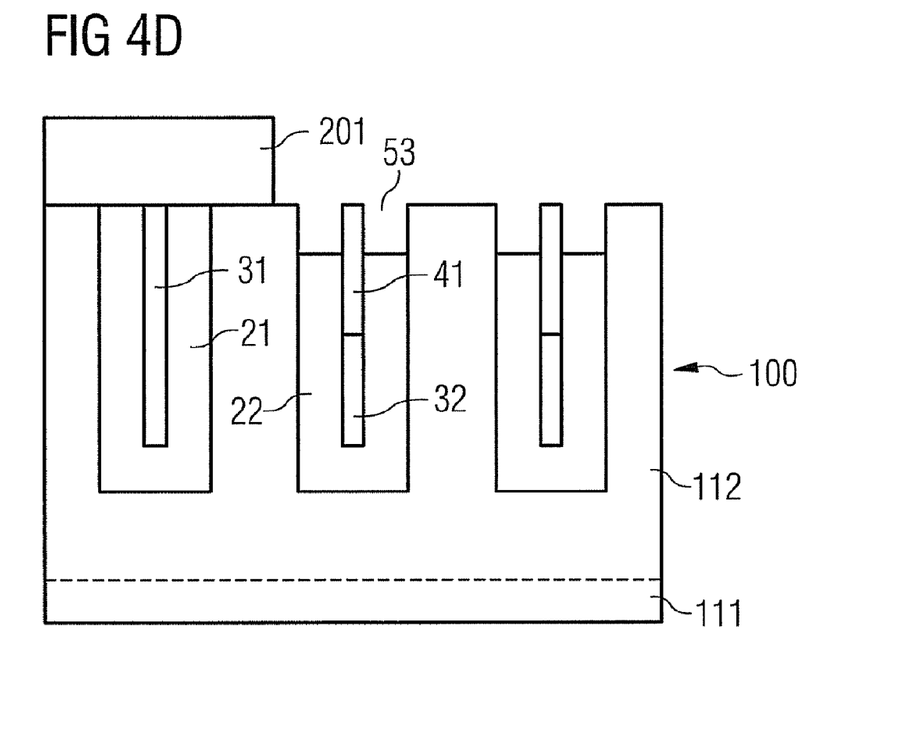

Referring to FIG. 4D, cutouts 53 are subsequently produced in the region of the first trenches. In this case, the cutouts 53 are delimited toward the sides by the semiconductor body 100 and the insulated plates 41 and downwardly by the second field plate dielectrics 22 produced after the partial removal of dielectric material.

Figure 4E:
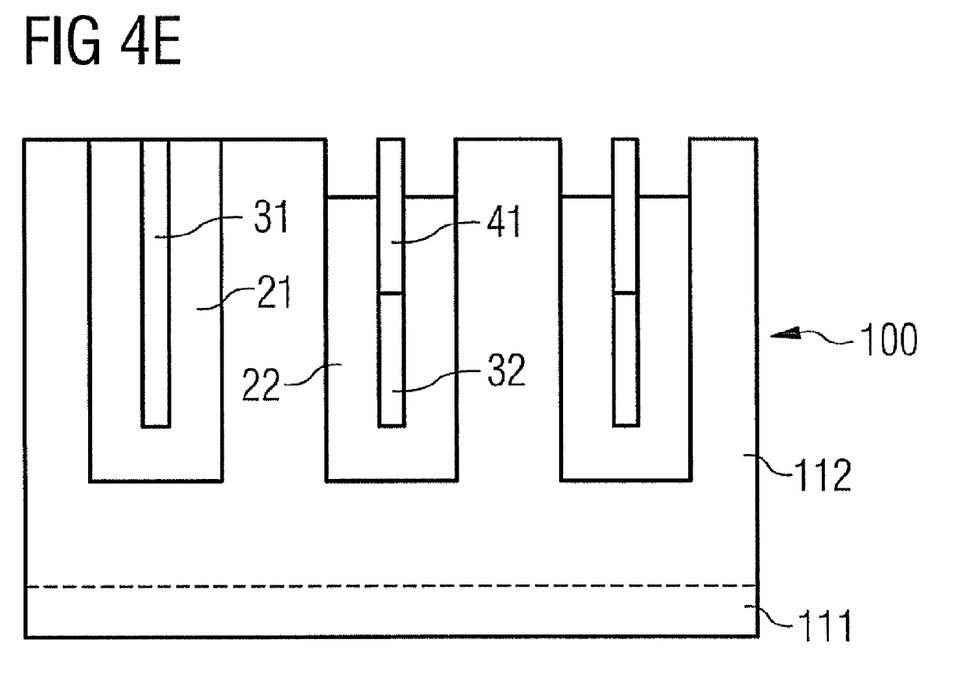

After the removal of the protective layer 201, the result of which is illustrated in FIG. 4E, it is possible to carry out the method processes for producing the gate electrodes as explained with reference to FIGS. 3A and 3B. Furthermore, it is possible to implement the method processes for producing the body and source zones as likewise already explained above. The result of such a production method is a transistor component having transistor cells such as are illustrated in the middle part of FIG. 1, that is to say transistor cells having a field plate 32 which does not extend as far as a first side 101 of the semiconductor body in a vertical direction, but rather adjacent to which there is an insulating plate in a direction of the first side 101.

Figure 5A:
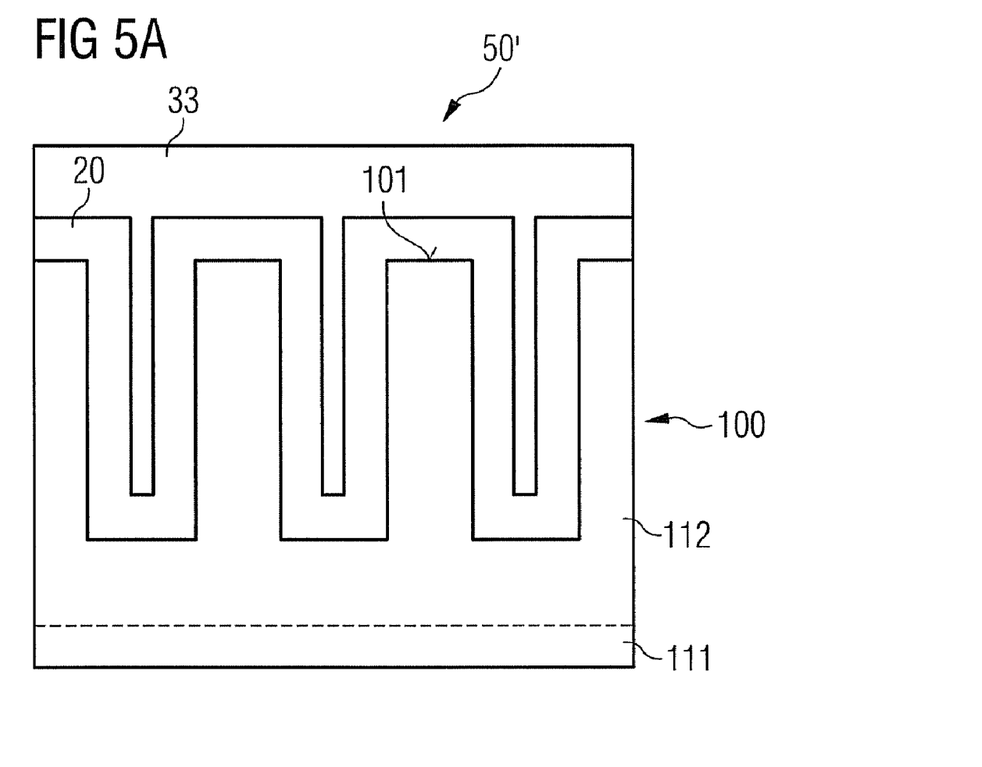
FIG. 5 illustrates an example of a method for producing a field plate layer for a method in accordance with FIG. 4.
Figure 5B:
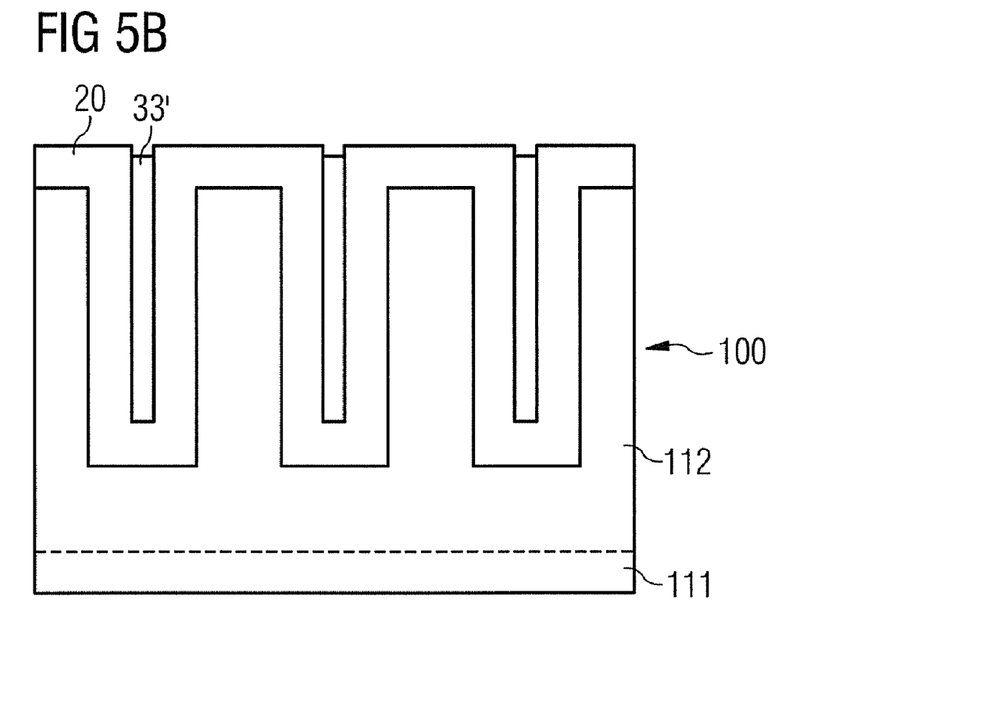

A possible method for producing the field plate layer having three different partial layers as explained with reference to FIG. 4A is explained below with reference to FIGS. 5A to 5D. After the production of the field plate dielectric layer 20 at uncovered areas of the trenches and above the first side 101 of the semiconductor body 100, the residual trenches 50 produced are subsequently filled with a layer 33 composed of an electrically conductive material at least as far as the level of the first side 101 of the semiconductor body 100. In this case, the layer composed of electrically conductive material can be produced in particular in such a way that the layer completely covers the field plate dielectric layer 20, as is illustrated in the example in accordance with FIG. 5A. Referring to FIG. 5B, the electrically conductive layer 33 is subsequently removed from the field plate dielectric layer 20 above the first side 101. This removal of the electrical layer 33 is effected by using an etching method, for example. In this case, the etching method is carried out until the layer 33 has been completely removed from the field plate dielectric layer 20 above the first side 101. The result is layer sections 33' of the electrically conductive layer 33 which are only present in the residual trenches 50' and which fill the residual trenches 50' in a vertical direction at least as far as the level of the first side 101—even beyond that in the example.

Figure 5C:
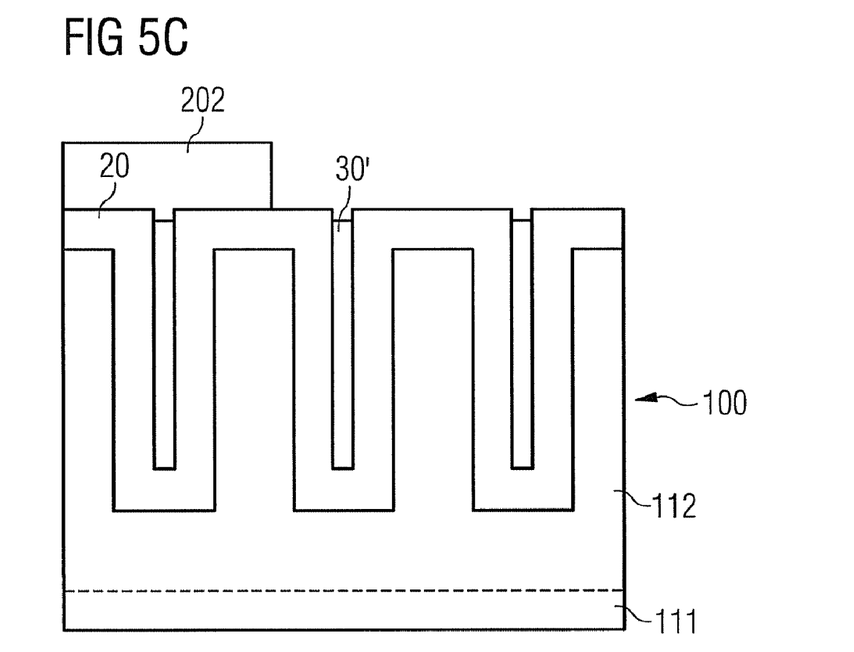

Referring to FIG. 5C, a protective layer 202 is subsequently applied above the second trenches, the protective layer leaving the first trenches free.

Figure 5D:
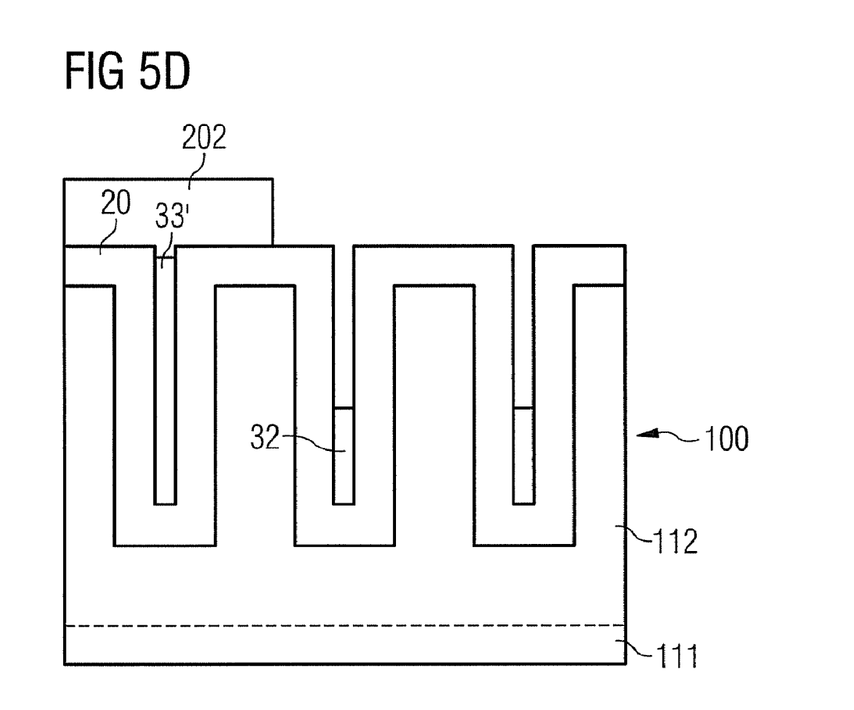

Referring to FIG. 5D, the sections 33' of the electrically conductive layer that remained in the residual trenches of the first trenches are etched back, such that the field plates 32 arise in the first trenches. In this case, the protective layer 202 protects the section 33' of the electrically conductive layer in the second trenches. Afterward, the protective layer 202 is removed and the insulation layer 40 is deposited on the arrangement thus produced, which as a result leads to the arrangement illustrated in FIG. 4A.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a transistor component having a field plate, comprising:
   providing a semiconductor body having a first side and having at least one first trench extending into the semiconductor body proceeding from the first side;
   producing a field plate dielectric layer on the first side and at uncovered areas of the first trench in such a way that a residual trench remains;
   producing a field plate layer in the residual trench, including applying an electrically conductive layer on the field plate dielectric layer in such a way that the residual trench is completely filled, wherein the electrically conductive layer is applied in such a way that it covers the field plate dielectric layer above the first side of the semiconductor body;
   uncovering the first side of the semiconductor body by using a polishing method, wherein the electrically conductive layer is partially removed during the polishing method, such that the field plates are formed in the residual trenches; and
   partially removing the field plate dielectric layer from the at least one first trench proceeding from the first side.

2. The method of claim 1, wherein the semiconductor body has at least one second trench proceeding from the first side, and wherein the method further comprises:

producing a protective layer over at least one of the second trenches, which protects the field plate dielectric layer in this trench against partial removal.

3. The method of claim 1, wherein the polishing method is a mechanical polishing method or a chemical-mechanical polishing method.

4. The method of claim 1, wherein producing the field plate dielectric layer includes thermal oxidation of the semiconductor body.

5. The method of claim 1, wherein producing the field plate dielectric layer includes depositing a dielectric layer.

6. The method of claim 1, which furthermore comprises:
producing a gate dielectric layer at least at uncovered areas of the at least one first trench;
producing a gate electrode on the gate dielectric layer.

7. The method of claim 1, wherein producing the field plate layer comprises:
producing a first partial layer composed of an electrically conductive material which partially fills the residual trench and which forms field plates;
producing a second partial layer composed of a dielectric material which completely fills the residual trench.

8. A method for producing a transistor component having a field plate, comprising:
providing a semiconductor body having a first side and having at least one first trench extending into the semiconductor body proceeding from the first side;
producing a field plate dielectric layer on the first side and at uncovered areas of the first trench in such a way that a residual trench remains;
producing a field plate layer in the residual trench;
uncovering the first side of the semiconductor body by using a polishing method; and
partially removing the field plate dielectric layer from the at least one first trench proceeding from the first side wherein at least two trenches are produced, and wherein producing the field plate layer in the at least one first trench comprises:
producing a first partial layer composed of an electrically conductive material which partially fills the residual trench of the at least one first trench and which forms a field plate;
producing a second partial layer composed of a dielectric material which fills the residual trench at least as far as the level of the first side of the semiconductor body; and
producing a field plate layer in at least one second trench including filling a residual trench of the at least one second trench with an electrically conductive material at least as far as the level of the first side of the semiconductor body;
wherein filling the residual trench of the at least one first trench and of the at least one second trench with an electrically conductive material comprises:
producing a material layer composed of an electrically conductive material which completely covers the field plate dielectric layer; and
removing the material layer composed of the electrically conductive material at least from those regions of the field plate dielectric layer above the first side of the semiconductor body during the polishing process.

9. The method of claim 8, wherein producing the first partial layer comprises:
filling the residual trenches of the at least one first and of the at least one second trenches with an electrically conductive material at least as far as the level of the first side of the semiconductor body;
producing a mask layer above the at least one second one of the trenches; and
partially removing the electrically conductive material from the residual trench of the at least one first trench proceeding from the first side of the semiconductor body.

10. A method for making an integrated circuit including a transistor component comprising:
providing a semiconductor body having a first side and a first trench extending from the first side into the semiconductor body;
producing a field plate dielectric layer on the first side and at uncovered areas of the first trench such that residual trench remains;
producing a field plate layer in the residual trench, including applying an electrically conductive layer on the field plate dielectric layer in such a way that the residual trench is completely filled, wherein the electrically conductive layer is applied in such a way that it covers the field plate dielectric layer above the first side of the semiconductor body, and wherein the electrically conductive layer is partially removed during a polishing method, such that field plates are formed in the residual trenches; and
partially removing the field plate dielectric layer from the at least one first trench by the polishing method.

11. The method of claim 10, wherein at least two trenches extending into the semiconductor body proceeding from the first side are produced and which furthermore comprises:
producing a protective layer over at least one of the second trenches, which protects the field plate dielectric layer in this trench against partial removal.

12. The method of claim 10, uncovering the first side of the semiconductor body by using a polishing method.

13. The method of claim 10, wherein producing the field plate dielectric layer includes thermal oxidation of the semiconductor body.

14. The method of claim 10, wherein producing the field plate dielectric layer includes depositing a dielectric layer.

15. The method of claim 10, which furthermore comprises:
producing a gate dielectric layer at least at uncovered areas of the at least one first trench;
producing a gate electrode on the gate dielectric layer.

16. The method of claim 10, wherein producing the field plate layer comprises:
producing a first partial layer composed of an electrically conductive material which partially fills the residual trench and which forms field plates;
producing a second partial layer composed of a dielectric material which completely fills the residual trench.

* * * * *